United States Patent
Kang et al.

(10) Patent No.: US 10,410,931 B2
(45) Date of Patent: Sep. 10, 2019

(54) FABRICATING METHOD OF NANOSHEET TRANSISTOR SPACER INCLUDING INNER SPACER

(71) Applicant: SAMSUNG ELECTRONICS CO., LTD., Suwon-si, Gyeonggi-do (KR)

(72) Inventors: Myung Gil Kang, Suwon-si (KR); Hyun Seung Song, Hwaseong-si (KR); Sang Woo Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/837,613

(22) Filed: Dec. 11, 2017

(65) Prior Publication Data

US 2018/0197794 A1 Jul. 12, 2018

Related U.S. Application Data

(60) Provisional application No. 62/443,934, filed on Jan. 9, 2017.

(51) Int. Cl.
*H01L 21/8238* (2006.01)
*H01L 29/66* (2006.01)
(Continued)

(52) U.S. Cl.
CPC ...... *H01L 21/823821* (2013.01); *B82Y 10/00* (2013.01); *H01L 21/0259* (2013.01); *H01L 21/02532* (2013.01); *H01L 21/26506* (2013.01); *H01L 21/30604* (2013.01); *H01L 21/823412* (2013.01); *H01L 21/823468* (2013.01); *H01L 21/823864* (2013.01); *H01L 21/823878* (2013.01); *H01L 29/0649* (2013.01); *H01L 29/0653* (2013.01); *H01L 29/0673* (2013.01);
(Continued)

(58) Field of Classification Search
CPC .......... H01L 21/02532; H01L 21/0259; H01L 21/308; H01L 21/467; H01L 21/823412; H01L 21/824368; H01L 21/823807; H01L 21/823864; H01L 29/0653; H01L 29/0673; H01L 29/66431; H01L 29/6656; H01L 29/778; Y10S 977/755; Y10S 977/888; Y10S 977/938; B82Y 40/00
See application file for complete search history.

(56) References Cited

U.S. PATENT DOCUMENTS

| 5,612,563 A | 3/1997 | Fitch et al. |
| 7,598,516 B2 | 10/2009 | Avouris et al. |

(Continued)

*Primary Examiner* — Stephen W Smoot
(74) *Attorney, Agent, or Firm* — F. Chau & Associates, LLC

(57) ABSTRACT

A fabricating method of a nanosheet transistor includes: forming a plurality of sacrificial layers and a plurality of channel layers on a substrate, wherein the sacrificial layers and the channel layers are alternately arranged; forming a plurality of gates on an uppermost channel layer, wherein the gates are spaced apart from each other; forming a mask on each of the gates; selectively etching the sacrificial layers between the gates, wherein the sacrificial layers between the gates are removed by the etching; depositing a spacer material along sidewalls of the gates and in areas from which the sacrificial layers have been removed; and etching the spacer material to form sidewall spacers along the sidewalls of the gates and inner spacers between the channel layers.

17 Claims, 17 Drawing Sheets

(51) Int. Cl.
    *H01L 29/06*     (2006.01)
    *H01L 21/265*     (2006.01)
    *H01L 21/306*     (2006.01)
    *H01L 21/8234*     (2006.01)
    *H01L 21/02*     (2006.01)
    *H01L 29/775*     (2006.01)
    *B82Y 10/00*     (2011.01)
    *H01L 29/423*     (2006.01)

(52) U.S. Cl.
    CPC .... *H01L 29/42392* (2013.01); *H01L 29/6656* (2013.01); *H01L 29/6681* (2013.01); *H01L 29/66439* (2013.01); *H01L 29/66553* (2013.01); *H01L 29/775* (2013.01); *H01L 21/823807* (2013.01)

(56) References Cited

U.S. PATENT DOCUMENTS

| | | |
|---|---|---|
| 8,003,453 B2 | 8/2011 | Avouris et al. |
| 8,173,993 B2 | 5/2012 | Bangsaruntip et al. |
| 8,609,481 B1 | 12/2013 | Franklin et al. |
| 9,362,355 B1 | 6/2016 | Cheng et al. |
| 9,728,621 B1 * | 8/2017 | Cheng ................ H01L 29/4983 |
| 9,748,335 B1 * | 8/2017 | Bentley .............. H01L 29/0673 |
| 2016/0071729 A1 | 3/2016 | Hatcher et al. |
| 2017/0221708 A1 * | 8/2017 | Bergendahl ....... H01L 29/66742 |
| 2017/0330960 A1 * | 11/2017 | Bauer .............. H01L 21/02439 |

* cited by examiner

FABRICATING METHOD OF NANOSHEET TRANSISTOR SPACER INCLUDING INNER SPACER

CROSS-REFERENCE TO RELATED APPLICATION

This U.S. nonprovisional application claims priority under 35 U.S.C. § 120 to U.S. provisional application No. 62/443,934 filed Jan. 9, 2017 in the U.S. Patent and Trademark Office, the disclosure of which is incorporated by reference herein in its entirety.

TECHNICAL FIELD

The present inventive concept relates to a method of fabricating a nanosheet transistor, and more particularly, to a method of fabricating a nanosheet transistor spacer including an inner spacer.

DISCUSSION OF THE RELATED ART

As the fin width in a fin field effect transistor (FinFET) approaches 5 nm, channel width variations could cause undesirable variability and mobility loss. Nanosheet FETs are being studied as an alternative to fin field effect transistors. The nanosheet FET is a multigate transistor. In the multigate transistor, there is provided a silicon body in a fin or nanowire shape formed on a substrate, with a gate being formed on a surface of the silicon body.

The multigate transistor includes an inner spacer and a sidewall spacer, among others. An inner spacer is typically formed by an additional process to the sidewall spacer. For example, after making a sidewall spacer and recessing a source/drain region, a space for the inner spacer is made by wet or vapor etch removal. Then, the inner spacer is formed by dielectric material deposition.

In fabricating the source/drain regions via selective epitaxial growth, the dielectric material of the inner spacer is slightly etched to reveal channel material. However, because the additional dielectric material of the inner spacer is present, there is a reduced open region in which the source/drain recess can be made. Furthermore, because the inner spacer region is defined by wet of vapor etch control, fine control of the thickness of the inner spacer may not be possible.

SUMMARY

In an exemplary embodiment of the present inventive concept, there is provided a fabricating method of a nanosheet transistor, the method including: forming a plurality of sacrificial layers and a plurality of channel layers on a substrate, wherein the sacrificial layers and the channel layers are alternately arranged; forming a plurality of gates on an uppermost channel layer, wherein the gates are spaced apart from each other; forming a mask on each of the gates; selectively etching the sacrificial layers between the gates, wherein the sacrificial layers between the gates are removed by the etching; depositing a spacer material along sidewalls of the gates and in areas from which the sacrificial layers have been removed; and etching the spacer material to form sidewall spacers along the sidewalls of the gates and inner spacers between the channel layers.

In an exemplary embodiment of the present inventive concept, there is provided a fabricating method of a nanosheet transistor, the method including: forming a plurality of sacrificial layers and a plurality of channel layers on a substrate, wherein the sacrificial layers and the channel layers are alternately arranged; forming a plurality of gates on an uppermost channel layer, wherein the gates are spaced apart from each other; forming a mask on each of the gates; depositing an oxide layer between the gates on the uppermost channel layer; depositing a polysilicon layer or a nitride layer on the oxide layer in a PMOS region; removing the polysilicon layer or the nitride layer deposited on the oxide layer in the PMOS region; selectively etching the sacrificial layers between the gates, wherein the sacrificial layers between the gates are removed by the etching; depositing a spacer material along sidewalls of the gates and in areas from which the sacrificial layers have been removed; and etching the spacer material to form sidewall spacers along the sidewalls of the gates and inner spacers between the channel layers.

In an exemplary embodiment of the present inventive concept, there is provided a fabricating method of a nanosheet transistor, the method including: forming a plurality of sacrificial layers and a plurality of channel layers on a substrate, wherein the sacrificial layers and the channel layers are alternately arranged; forming a plurality of gates on an uppermost channel layer, wherein the gates are spaced apart from each other; forming a mask on each of the gates; depositing an oxide layer between the gates on the uppermost channel layer; depositing a polysilicon layer or a nitride layer on the oxide layer in an NMOS region; removing the polysilicon layer or the nitride layer deposited on the oxide layer in the NMOS region; selectively etching the sacrificial layers between the gates, wherein the sacrificial layers between the gates are removed by the etching; depositing a spacer material along sidewalls of the gates and in areas from which the sacrificial layers have been removed; and etching the spacer material to form sidewall spacers along the sidewalls of the gates and inner spacers between the channel layers.

DETAILED DESCRIPTION OF THE EMBODIMENTS

Figure 1A:
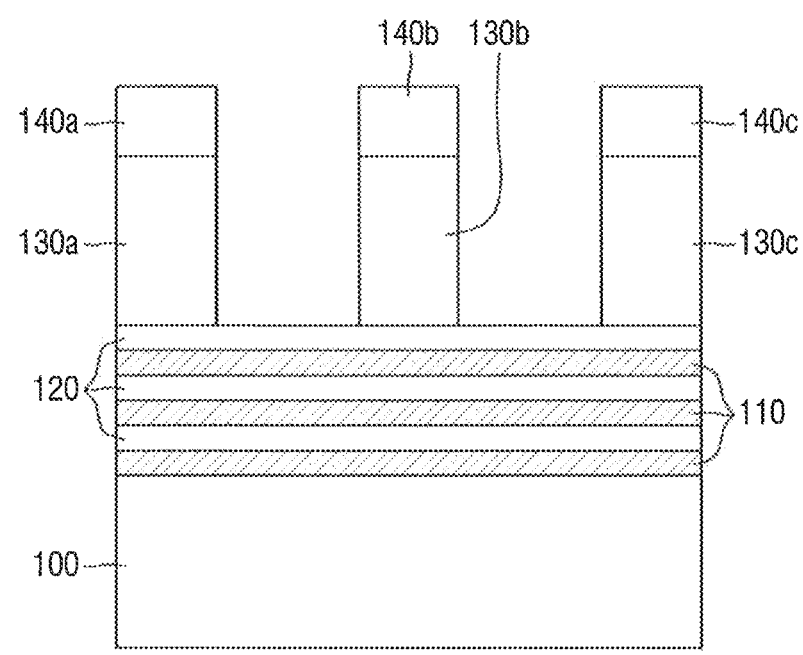
FIGS. 1A to 1D illustrate a fabricating method of a nanosheet transistor according to an exemplary embodiment of the present inventive concept.

Exemplary embodiments of the present inventive concept will now be described more fully hereinafter with reference to the accompanying drawings. The present inventive concept may, however, be embodied in many different forms and should not be construed as being limited to the embodiments set forth herein. Like reference numerals may refer to like elements throughout the specification and drawings.

In an exemplary embodiment of the present inventive concept, there is disclosed a spacer process in which both an inner spacer and a sidewall spacer are simultaneously formed. In order to make the inner spacer between a nanosheet, a diffusion region of the nanosheet is released before making the sidewall spacer with a poly gate structure acting as a supporting beam and mask.

For example, in an exemplary embodiment of the present inventive concept, a space for the inner spacer is made by wet or vapor etch before spacer deposition with the poly gate structure acting as a supporting beam and mask. This way, the inner spacer can be formed in the same process used to form the sidewall spacer. In addition, an ion implantation process on the source/drain region before releasing the diffusion region makes selective etching possible, since the etch rate of an exposed area due to the ion implantation process increases. Therefore, there is finer control of the inner spacer region. In other words, the thickness and position of the inner spacer may be more precisely controlled.

FIGS. 1A to 1D illustrate a fabricating method of a nanosheet transistor according to an exemplary embodiment of the present inventive concept.

In particular, FIGS. 1A to 1D show a single spacer process for a sidewall spacer and an inner spacer. Control of the inner spacer is done with an ion implantation process and a selective etch. In FIGS. 1A to 1D, there is shown the case where a single channel material is used for NMOS and PMOS.

As shown in FIG. 1A, there is a substrate 100 with layers 110 and 120 alternately stacked thereon. The substrate 100 may be, for example, bulk silicon. Alternatively, the substrate 100 may be a silicon substrate, or a substrate made of other materials including, for example, germanium, silicon germanium, indium antimonide, a lead telluride compound, indium arsenide, indium phosphide, gallium arsenide, or gallium antimonide, but exemplary embodiments of the present inventive concept are not limited thereto. The substrate 100 may also be an epitaxial layer formed on a base substrate.

Layer 110 may be a sacrificial layer, and layer 120 may be nanosheet channel layer. The sacrificial layer 110 and the channel layer 120 may be made of different semiconductor materials from each other. For example, the sacrificial layer 110 may consist of silicon germanium and the channel layer 120 may consist of silicon. However, the present inventive concept is not limited thereto. For example, the sacrificial layer 110 may include a semiconductor material or a crystallized metal material. In the case of a PMOS, the channel layer 120 may include a material having a high hole mobility, and in the case of an NMOS, the channel layer 120 may include a material having a high electron mobility.

Once the materials for the sacrificial layer 110 and the channel layer 120 are selected, the process includes growing a stack of alternating layers of the sacrificial material and the channel (or active) material over the substrate 100.

A fin structure may be formed by an etching process on the stack of the sacrificial layer 110 and the channel layer 120 while using a mask on the uppermost layer. The fin structure may be formed on the substrate 100 and project from the substrate 100. A gate structure 130a, 130b and 130c is then formed on the fin structure to cross the fin structure. The gate structure 130a, 130b and 130c may include polysilicon. However, the present inventive concept is not limited thereto. Hereinafter, the gate structure 130a, 130b and 130c may be referred to as a poly gate, or in plural.

Figure 4:
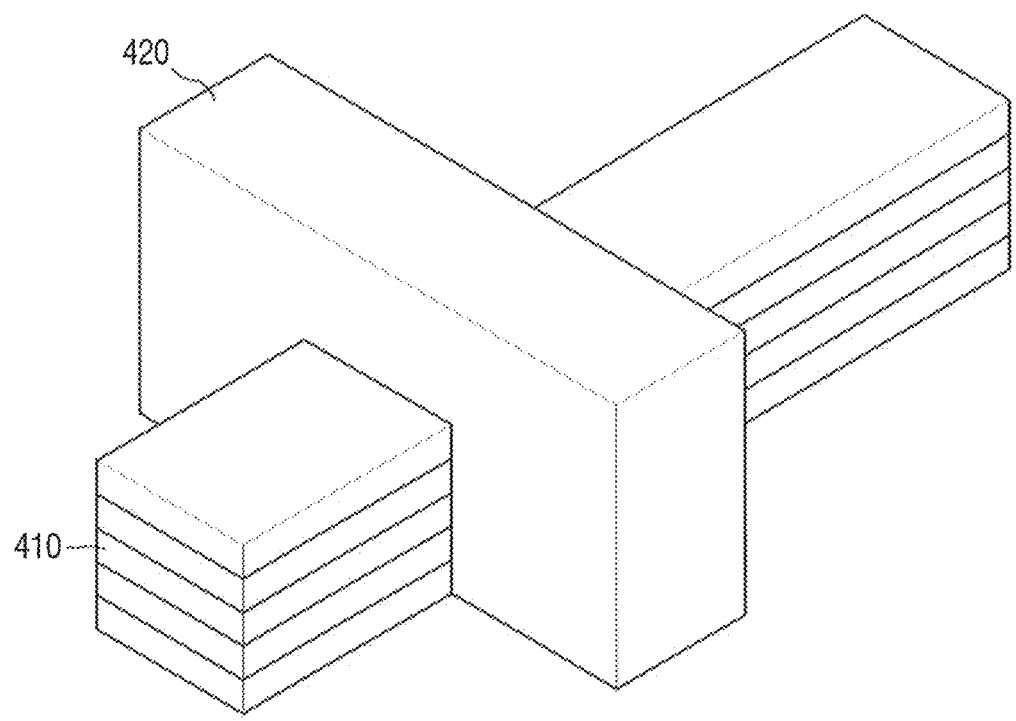
FIG. 4 illustrates a starting structure according to an exemplary embodiment of the present inventive concept.

An example of the fin structure can be seen in FIG. 4. For example, in reference to FIG. 4, there is shown a fin structure 410 extending in a first direction and a gate structure 420 extending in a second direction that crosses the first direction. It is to be understood that in FIG. 4 there is shown a single gate structure 420. This gate structure is patterned to form the several gate structures shown in FIG. 1A to 1D. It is to be further understood that the number of gate structures shown in FIG. 1A to 1D is merely exemplary. In other words, there may be more than three gate structures.

After the formation and patterning of the gate structures 130a, 130b and 130c, a hardmask 140a, 140b and 140c may deposited on a top surface of the gate structures 130a, 130b and 130c. The hardmask 140a, 140b and 140c may consist of silicon nitride, but the present inventive concept is not limited thereto.

Figure 1B:
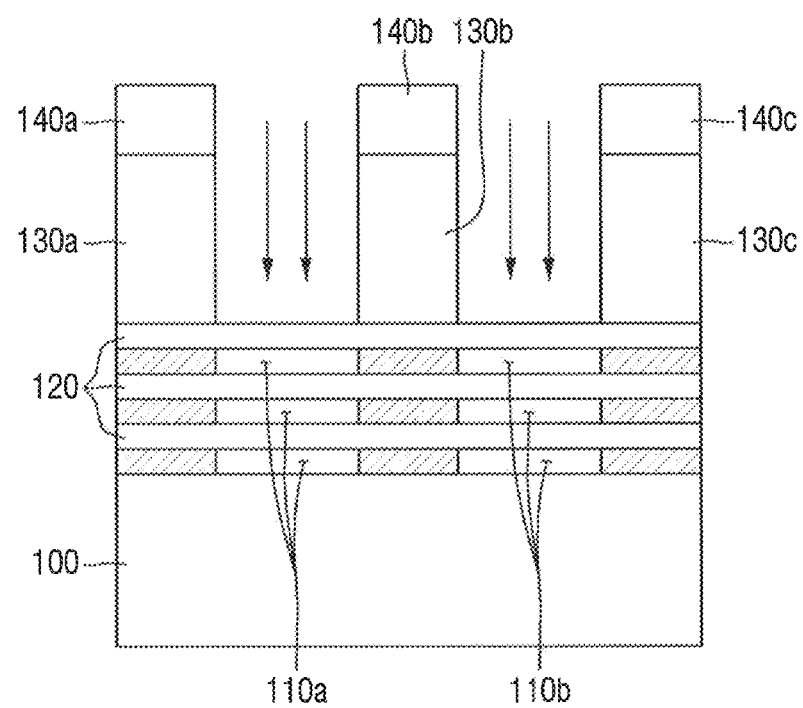

Referring now to FIG. 1B, in the method according to an exemplary embodiment of the present inventive concept, the areas between the gate structures 130a, 130b and 130c may be subject to an ion implantation process. The ion implantation process is optional. However, this process can enhance the etch rate of the silicon germanium sacrificial layer 110, for example.

After the ion implantation process, the sacrificial layers 110 may be selectively etched. This results on the removal of the sacrificial layers 110 from the areas between the gate structures 130a, 130b and 130c, thereby forming empty spaces 110a and 110b between the channel layers 120.

The etching may be a wet etching or a vapor etching. Thus, for example, silicon germanium sacrificial layers 110 that are not covered by the poly silicon gate structures 130a, 130b and 130c are removed selectively.

Figure 1C:
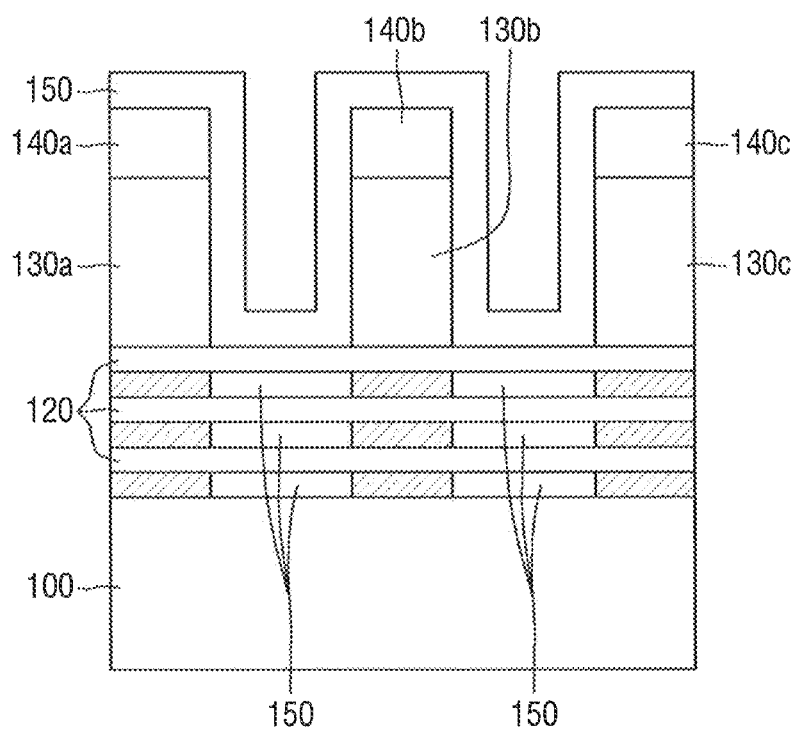

Referring now to FIG. 1C, a spacer material 150 is deposited on upper surfaces and sidewall surfaces of the gate structures 130a, 130b and 130c. The spacer material 150 is further deposited in the empty spaces 110a and 110b and on an uppermost channel layer 120 between the gate structures 130a, 130b and 130c. The spacer material 150 may include a dielectric material, for example, silicon nitride. However, the present inventive concept is not limited thereto. For example, the spacer material 150 may include, just silicon or just nitride. The spacer material 150 may also be silicon oxycarbonitride.

Figure 1D:
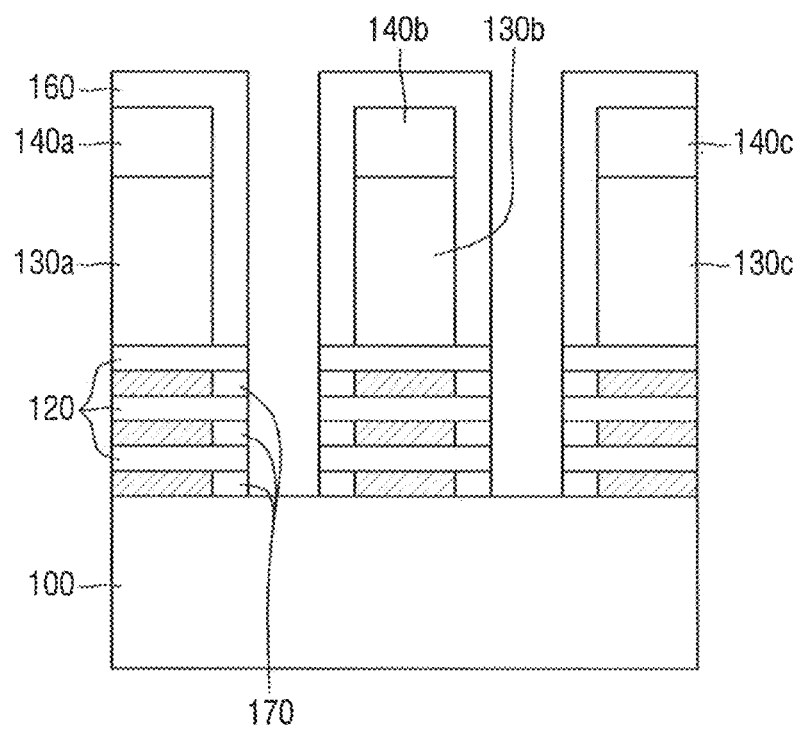

Referring now to FIG. 1D, the spacer material 150 may be etched to form sidewall spacers 160 and inner spacers 170 in source/drain recesses between the gate structures 130a, 130b and 130c.

Accordingly, in an exemplary embodiment of the present inventive concept, because the poly gate structure acts as a supporting beam and a mask and because a space for the inner spacer was made before the spacer material deposition, the sidewall spacer and the inner spacer can be formed simultaneously and with fine control of the inner spacer's thickness and position.

FIGS. 2A to 2F illustrate a fabricating method of a nanosheet transistor according to an exemplary embodiment of the present inventive concept.

FIGS. 2A to 2F show a variant of the process shown in FIGS. 1A to 1D. In particular, FIGS. 2A to 2F include additional steps for different channel type materials. In FIGS. 2A to 2F an NMOS region is removed and a PMOS region is kept.

Figure 2A:
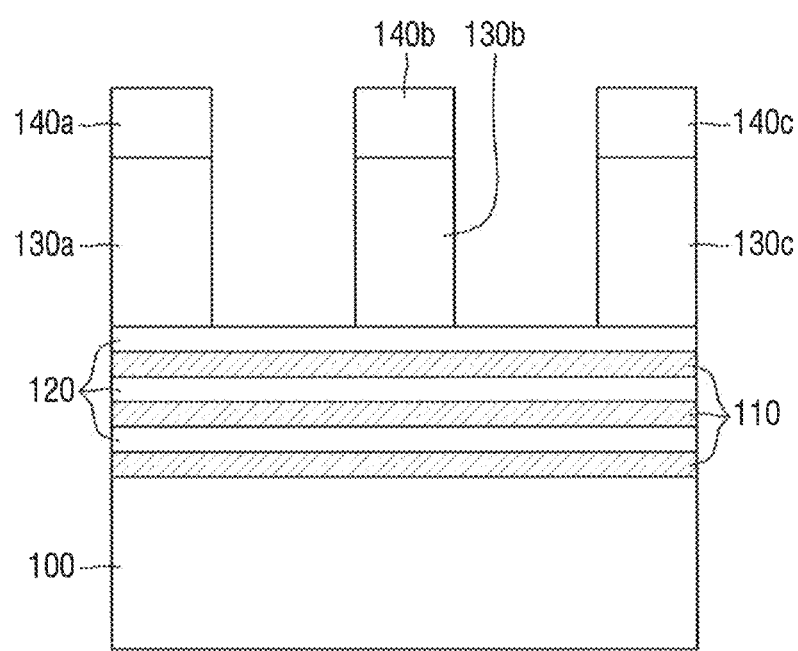
FIGS. 2A to 2F illustrate a fabricating method of a nanosheet transistor according to an exemplary embodiment of the present inventive concept.
Figure 2B:
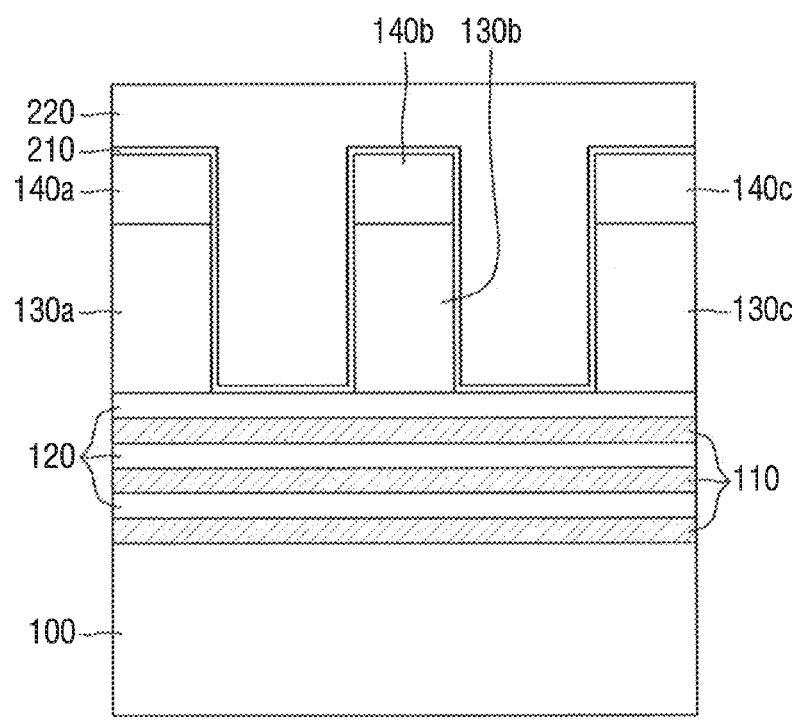

Referring now to FIG. 2A, there may be provided the same structure as shown in FIG. 1A. However, in FIGS. 2A to 2F, the layer 110 may be an NMOS layer. Also, the layer 120 may be a PMOS layer. In FIG. 2B, an oxide layer 210 may be deposited on parts of the structure in FIG. 2A. Also in FIG. 2B, a polysilicon layer (or a nitride layer) 220 may be deposited on top of the oxide layer 210. More specifically, the polysilicon layer 220 is deposited on the oxide layer 210 in a PMOS region.

Figure 2C:
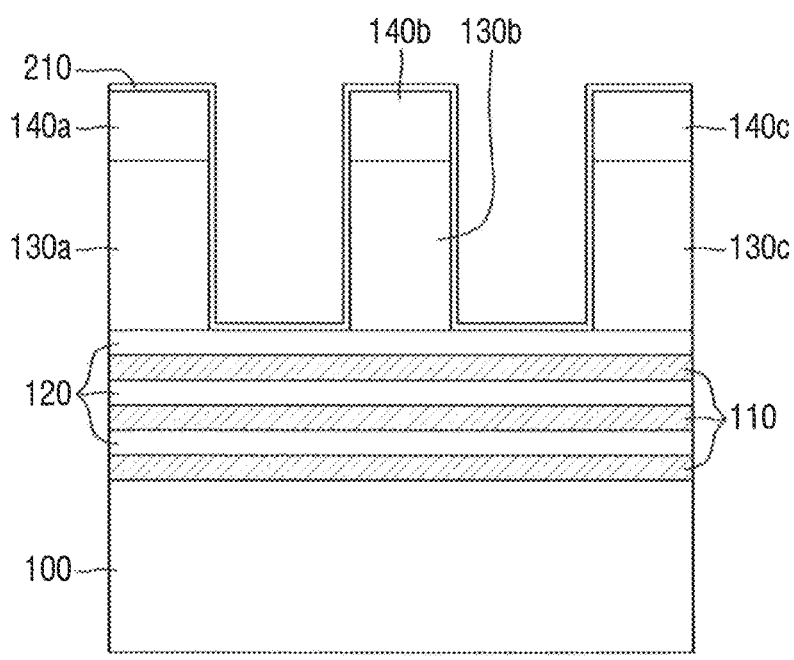
Figure 2D:
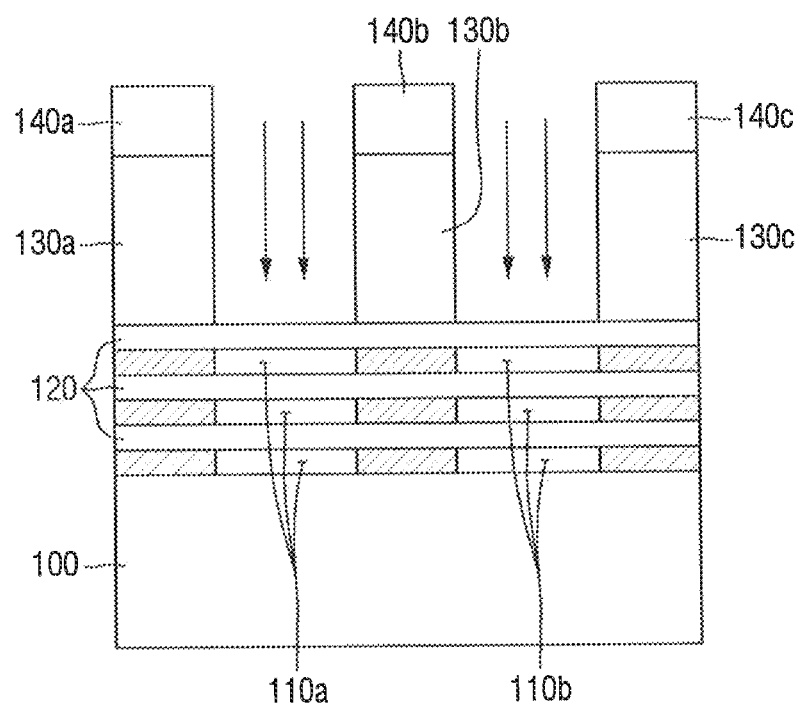
Figure 2E:
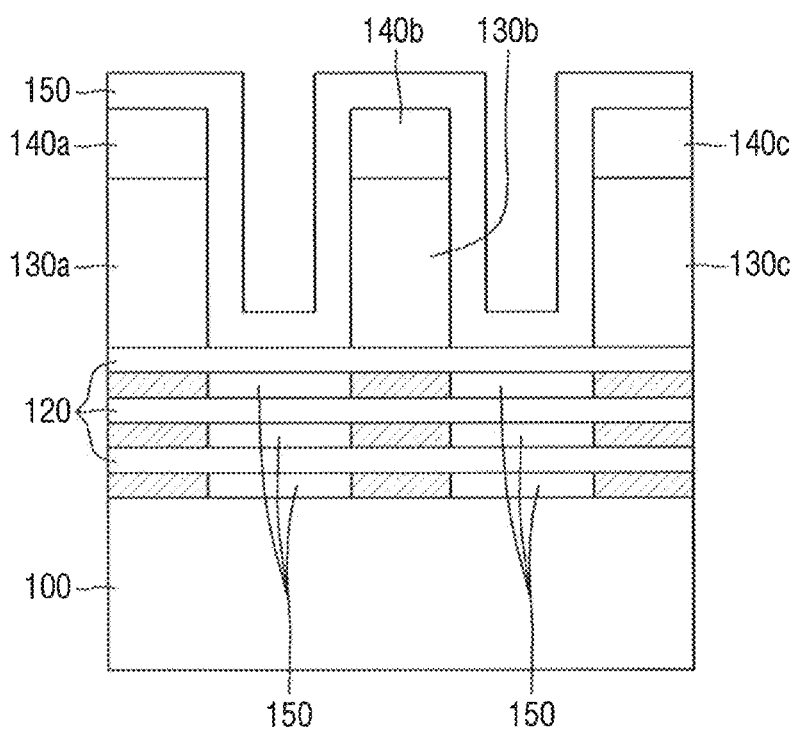
Figure 2F:
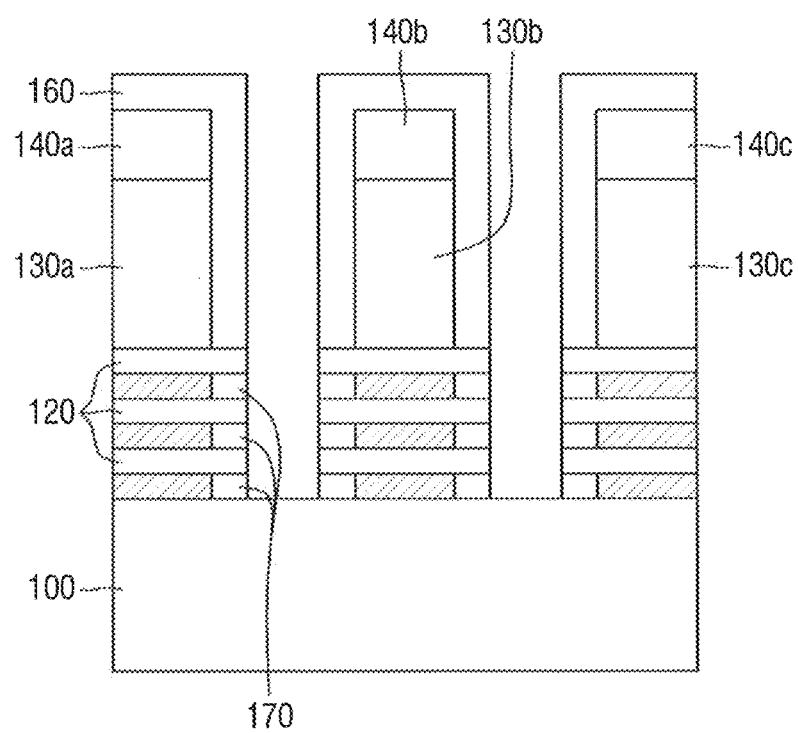

A photo patterning and a wet etching is performed to remove the polysilicon layer 220. The resulting structure is shown in FIG. 2C. At this stage, since the PMOS region was protected by the polysilicon layer 220, the NMOS region (e.g., SiGe) can be opened. Accordingly, in FIG. 2D, the NMOS layers 110 from the areas between the gate structures 130a, 130b and 130c are removed to form empty spaces 110a and 110b between the PMOS layers 120. Images in FIG. 2E and FIG. 2F correspond to images in FIG. 1C and FIG. 1D, and thus, a repetitive description will not be provided.

FIGS. 3A to 3F illustrate a fabricating method of a nanosheet transistor according to an exemplary embodiment of the present inventive concept.

FIGS. 3A to 3F show a variant of the process shown in FIGS. 1A to 1D. In particular, FIGS. 3A to 3F include additional steps for different channel type materials. In FIGS. 3A to 3F a PMOS region is removed and an NMOS region is kept.

Figure 3A:
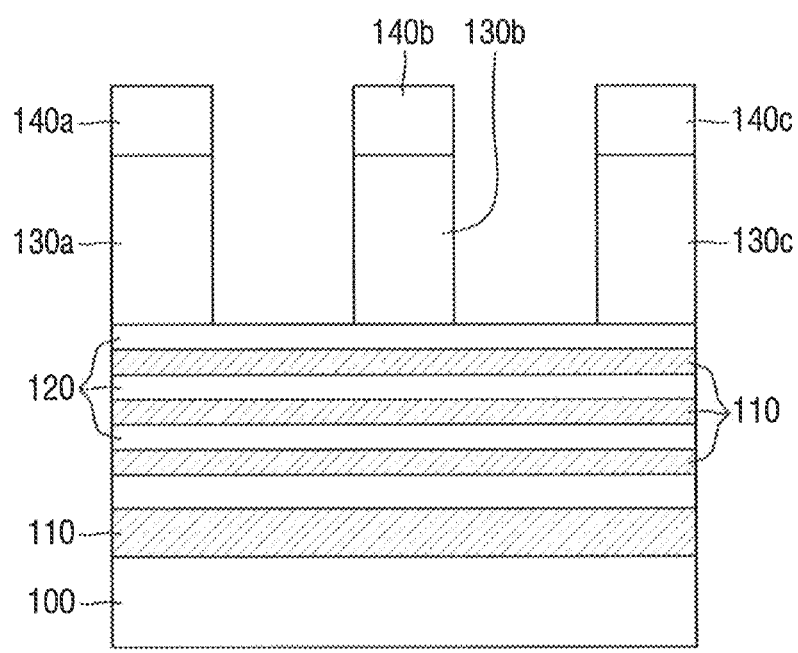
FIGS. 3A to 3F illustrate a fabricating method of a nanosheet transistor according to an exemplary embodiment of the present inventive concept.
Figure 3B:
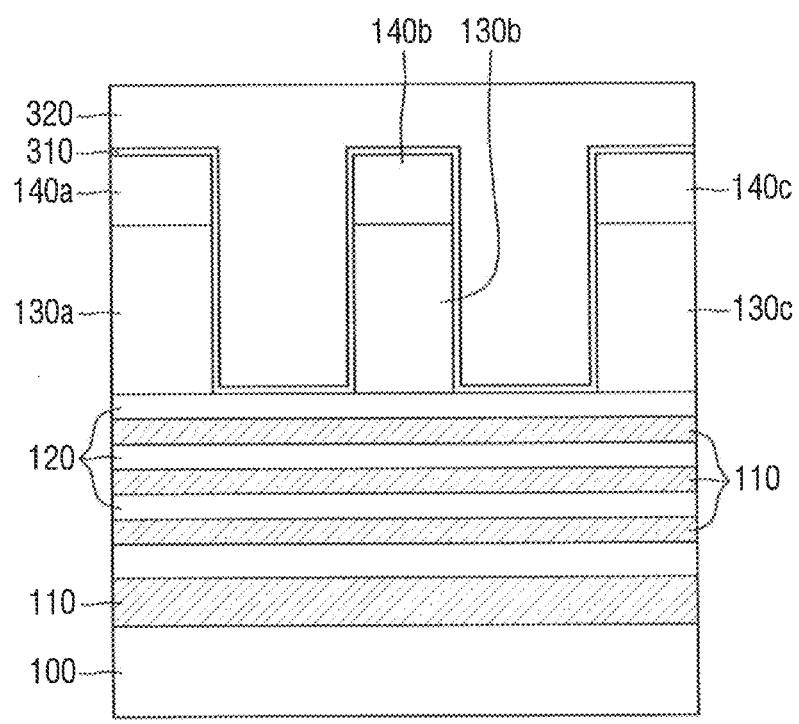

Referring now to FIG. 3A, there may be provided substantially the same structure as shown in FIG. 1A, and thus, a repetitive description will not be provided. However, in FIGS. 3A to 3F, the layer 110 may be an NMOS layer. Also, the layer 120 may be a PMOS layer. In FIG. 3B, similar to FIG. 2B, an oxide layer 310 may be deposited on parts of the structure in FIG. 3A. Also in FIG. 3B, a polysilicon layer (or a nitride layer) 320 may be deposited on top of the oxide layer 310. More specifically, the polysilicon layer 320 is deposited on the oxide layer 310 in an NMOS region.

Figure 3C:
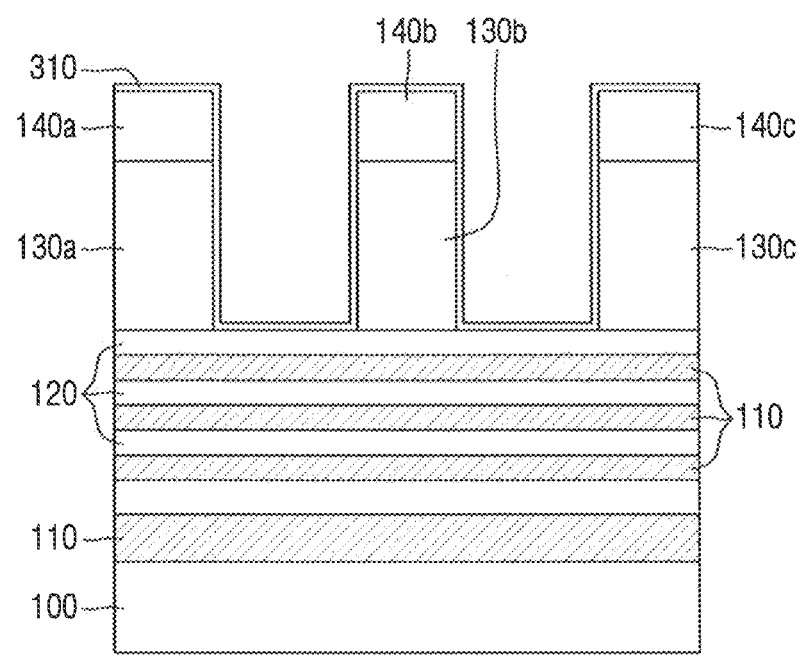
Figure 3D:
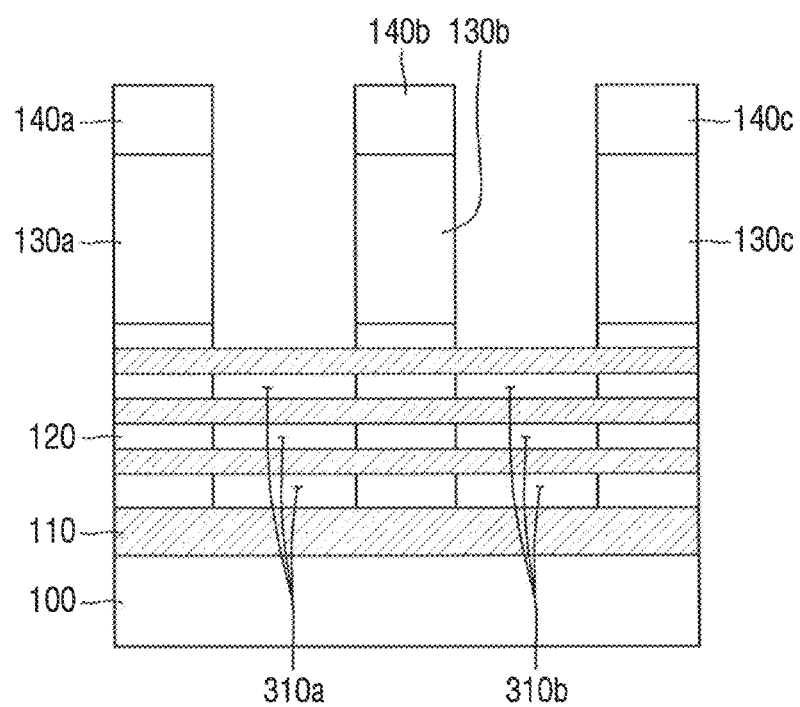

A photo patterning and a wet etching is performed to remove the polysilicon layer 320. The resulting structure is shown in FIG. 3C. At this stage, since the NMOS region was protected by the polysilicon 320, the PMOS region (e.g., Si) can be opened. Accordingly, in FIG. 3D, the PMOS layers 120 from the areas between the gate structures 130a, 130b and 130c are removed to form empty spaces 310a and 310b between the NMOS layers 110.

Figure 3E:
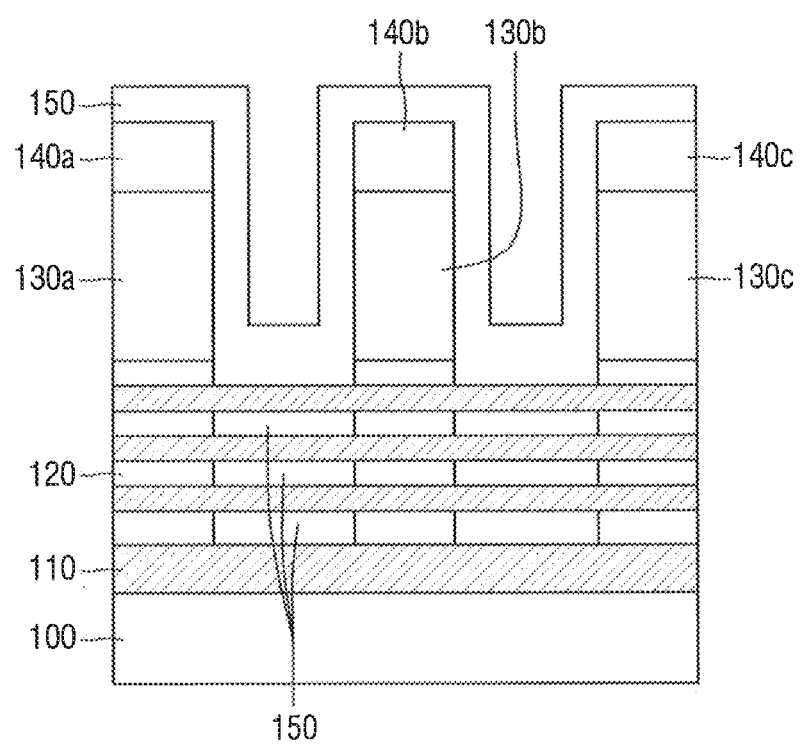
Figure 3F:
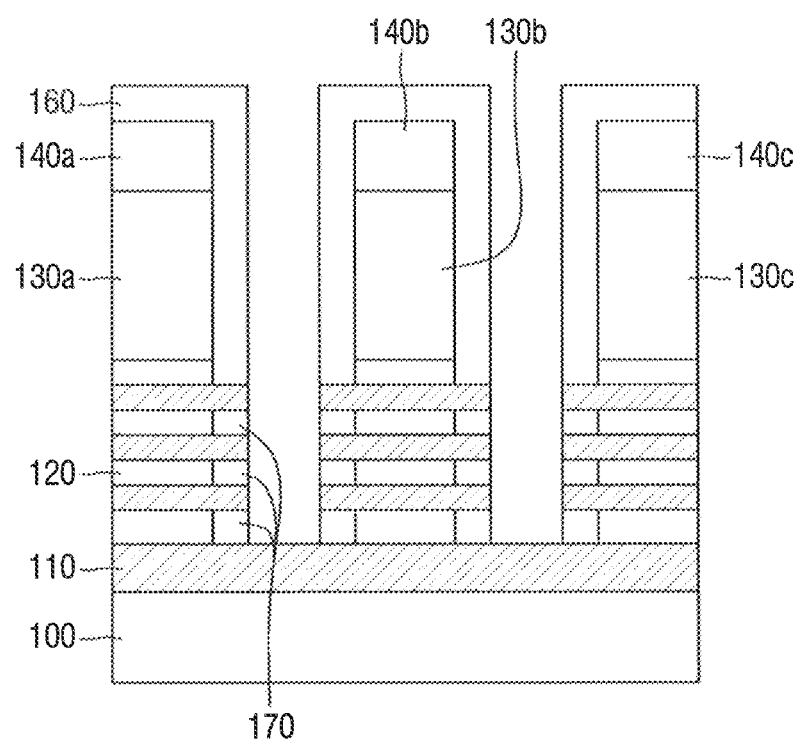

Images in FIG. 3E and FIG. 3F correspond to images in FIG. 1C and FIG. 1D, in that a spacer material 150 is deposited on upper surfaces and sidewall surfaces of the gate structures 130a, 130b and 130c. However, the spacer material 150 is further deposited in the empty spaces 310a and 310b and on an uppermost NMOS layer 110 between the gate structures 130a, 130b and 130c. In FIG. 3F, the spacer material 150 may be etched to form sidewall spacers 160 and inner spacers 170 in source/drain recesses between the gate structures 130a, 130b and 130c.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims.

What is claimed is:

1. A fabricating method of a nanosheet transistor, comprising:
   forming a plurality of sacrificial layers and a plurality of channel layers on a substrate, wherein the sacrificial layers and the channel layers are alternately arranged;
   forming a plurality of gates on an uppermost channel layer, wherein the gates are spaced apart from each other;
   forming a mask on each of the gates;
   selectively etching the sacrificial layers between the gates, wherein the sacrificial layers between the gates are removed by the etching, wherein an ion implantation process is performed before selectively etching the sacrificial layers between the gates;
   depositing a spacer material along sidewalls of the gates and in areas from which the sacrificial layers have been removed; and
   etching the spacer material to form sidewall spacers along the sidewalls of the gates and inner spacers between the channel layers.

2. The method of claim 1, wherein the sacrificial layers include silicon germanium.

3. The method of claim 1, wherein the channel layers include silicon.

4. The method of claim 1, wherein the gates include polysilicon.

5. The method of claim 1, wherein the mask is a hardmask.

6. The method of claim 1, wherein the mask includes silicon nitride.

7. The method of claim 1, wherein the selectively etching includes wet etching.

8. The method of claim 1, wherein the spacer material includes a dielectric material.

9. The method of claim 1, wherein the spacer material includes silicon nitride.

10. The method of claim 1, wherein the sidewall spacers and the inner spacers are simultaneously formed.

11. The method of claim 1, wherein an area in which the inner spacers are formed corresponds to a source or a drain region.

12. A fabricating method of a nanosheet transistor, comprising:
   forming a plurality of sacrificial layers and a plurality of channel layers on a substrate, wherein the sacrificial layers and the channel layers are alternately arranged;
   forming a plurality of gates on an uppermost channel layer, wherein the gates are spaced apart from each other;
   forming a mask on each of the gates;
   depositing an oxide layer between the gates on the uppermost channel layer;
   depositing a polysilicon layer or a nitride layer on the oxide layer in a PMOS region;
   removing the polysilicon layer or the nitride layer deposited on the oxide layer in the PMOS region;
   selectively etching the sacrificial layers between the gates, wherein the sacrificial layers between the gates are removed by the etching;
   depositing a spacer material along sidewalls of the gates and in areas from which the sacrificial layers have been removed; and
   etching the spacer material to form sidewall spacers along the sidewalls of the gates and inner spacers between the channel layers.

13. The fabricating method of claim 12, wherein the polysilicon layer or the nitride layer is removed by using photo patterning and wet etching.

14. The fabricating method of claim 12, wherein the sacrificial layers are removed from an NMOS region by the selectively etching.

15. A fabricating method of a nanosheet transistor, comprising:
   forming a plurality of sacrificial layers and a plurality of channel layers on a substrate, wherein the sacrificial layers and the channel layers are alternately arranged;
   forming a plurality of gates on an uppermost channel layer, wherein the gates are spaced apart from each other;
   forming a mask on each of the gates;

depositing an oxide layer between the gates on the uppermost channel layer;

depositing a polysilicon layer or a nitride layer on the oxide layer in an NMOS region;

removing the polysilicon layer or the nitride layer deposited on the oxide layer in the NMOS region;

selectively etching the sacrificial layers between the gates, wherein the sacrificial layers between the gates are removed by the etching;

depositing a spacer material along sidewalls of the gates and in areas from which the sacrificial layers have been removed; and etching the spacer material to form sidewall spacers along the sidewalls of the gates and inner spacers between the channel layers.

16. The fabricating method of claim 15, wherein the polysilicon layer or the nitride layer is removed by using photo patterning and wet etching.

17. The fabricating method of claim 15, wherein the sacrificial layers are removed from a PMOS region by the selectively etching.

* * * * *